(12) United States Patent
Pawlak

(10) Patent No.: US 7,122,452 B2
(45) Date of Patent: Oct. 17, 2006

(54) METHOD OF MANUFACTURING A SEMICONDUCTOR ON A SILICON ON INSULATOR (SOI) SUBSTRATE USING SOLID EPITAXIAL REGROWTH (SPER) AND SEMICONDUCTOR DEVICE MADE THEREBY

(75) Inventor: Bartlomiej Jan Pawlak, Leuven (BE)

(73) Assignees: Interuniversitair Microelektronica Centrum (IMEC) vzw, Leuven (BE); Koninklijke Philips Electronics, Eindhoven (NL)

( * ) Notice: Subject to any disclaimer, the term of this patent is extended or adjusted under 35 U.S.C. 154(b) by 0 days.

(21) Appl. No.: 11/081,798

(22) Filed: Mar. 15, 2005

(65) Prior Publication Data

US 2005/0227421 A1  Oct. 13, 2005

(30) Foreign Application Priority Data

Mar. 16, 2004  (EP) .................................. 04101078

(51) Int. Cl.
  *H01L 21/425*  (2006.01)
(52) U.S. Cl. ...................... 438/528; 438/305; 438/163; 438/162; 438/530; 257/E21.122
(58) Field of Classification Search ................ 438/528, 438/305, 163, 162, 530
  See application file for complete search history.

(56) References Cited

U.S. PATENT DOCUMENTS

| 5,948,162 | A | 9/1999 | Nakamura |
| 6,063,682 | A | 5/2000 | Sultan et al. |
| 6,514,829 | B1 | 2/2003 | Yu |
| 6,548,361 | B1 | 4/2003 | En et al. |
| 2003/0022461 | A1* | 1/2003 | Yang et al. .................. 438/439 |
| 2003/0027381 | A1 | 2/2003 | Buynoski et al. |
| 2003/0162336 | A1 | 8/2003 | Wei et al. |
| 2004/0087121 | A1* | 5/2004 | Kammler et al. ........... 438/528 |
| 2005/0215024 | A1* | 9/2005 | Nahm et al. ................ 438/420 |
| 2005/0260809 | A1* | 11/2005 | Tezuka et al. .............. 438/199 |

FOREIGN PATENT DOCUMENTS

JP  02004063780 A * 2/2004

* cited by examiner

*Primary Examiner*—Asok K. Sarkar
*Assistant Examiner*—Victor V. Yevsikov
(74) *Attorney, Agent, or Firm*—Knobbe Martens Olson & Bear LLP

(57) ABSTRACT

A method of producing a semiconductor device on a silicon on insulator (SOI) substrate is disclosed. In one aspect, the method comprises providing a device with a monocrystalline semiconductor layer on an insulating layer; providing a mask on the semiconductor layer to provide first shielded portions and first unshielded portions, amorphizing the first unshielded portions to yield first amorphized portions of the monocrystalline semiconductor layer, implanting a first dopant in the first amorphized portions, applying a first solid phase epitaxial regrowth action to the semiconductor device while using the first shielded portions as monocrystalline seeds.

10 Claims, 3 Drawing Sheets

METHOD OF MANUFACTURING A SEMICONDUCTOR ON A SILICON ON INSULATOR (SOI) SUBSTRATE USING SOLID EPITAXIAL REGROWTH (SPER) AND SEMICONDUCTOR DEVICE MADE THEREBY

BACKGROUND OF THE INVENTION

1. Field of the Invention

The present invention relates to a method for producing a semiconductor device comprising providing a device with a monocrystalline semiconductor layer on an insulating layer.

2. Description of the Related Technology

It is presently known to produce semiconductor devices on silicon on insulator (SOI) wafers or substrates. A problem however, may be formation of polycrystalline Si crystals during growing the silicon on the insulator. The formation of polycrystalline crystals can disrupt performance of transistors and other devices produced in the silicon layer on the insulator. In general, this is solved by providing one or more monocrystalline silicon seeds before growing the silicon layer. An example can be found in U.S. Pat. No. 5,948,162. A recent development in the manufacture of semiconductor devices is the use of Solid Phase Epitaxial Regrowth (SPER). An example of SPER is provided in U.S. Pat. No. 6,063,682. According to this prior art document SPER entails the heating of previously amorphized (or preamorphized) silicon within the range of 550° C. to 650° C. which causes the amorphized silicon to recrystallize to substantially uniform crystallized silicon.

SUMMARY OF CERTAIN INVENTIVE EMBODIMENTS

It is an aim of aspects of the present invention to provide a manufacturing process for producing semiconductor substrates and devices on SOI while using a SPER technique such that a monocrystalline silicon layer is produced on the insulator.

Aspects of the invention may therefore be characterized by providing a mask on said semiconductor layer to provide first shielded portions and first unshielded portions; amorphizing said first unshielded portions to yield first amorphized portions of said monocrystalline semiconductor layer; implanting a first dopant in said first amorphized portions; applying a first solid phase epitaxial regrowth action to said semiconductor device while using said first shielded portions as monocrystalline seeds.

In one embodiment, the method as described above is characterized by, in addition, providing a second mask on said semiconductor layer to provide second shielded portions and second unshielded portions, at least some of said second unshielded portions substantially coinciding with said first shielded portions; amorphizing said at least some of said second unshielded portions to yield second amorphized portions; implanting a second dopant in said second amorphized portions, applying a second solid phase epitaxial regrowth action to said semiconductor device.

Embodiments of this invention may offer perfect quality, single crystalline silicon after epitaxial regrowth. The technique can be seamlessly integrated into existing semiconductor fabrication processes and is easily applicable on SOI wafers. In particular, inventive embodiments can advantageously be used when dealing with thin layers.

Instead of SPER other techniques used for junction formation can be used like Liquid Phase Epitaxial Regrowth or Rapid Thermal Annealing.

BRIEF DESCRIPTION OF THE DRAWINGS

Embodiments of the invention will now be explained with reference to the accompanying drawings, wherein the same reference numbers refer to same parts.

FIG. 1 shows a silicon on insulator (SOI) device;

FIG. 2 shows the SOI device of FIG. 1 with a first mask formed thereon;

FIG. 3 shows the SOI device of FIG. 2 as exposed to a dopant action and resulting in a doped portion;

FIG. 4 shows the SOI device of FIG. 3, wherein the first mask has been removed;

FIG. 5 shows the SOI device of FIG. 4, wherein portions of the device are covered by a second mask;

FIG. 6 shows the SOI device of FIG. 5 as exposed to another dopant action and resulting in a doped portion;

FIG. 7 shows the SOI device of FIG. 6, wherein the second mask has been removed and a gate oxide and gate are formed on the doped portion.

DETAILED DESCRIPTION OF CERTAIN INVENTIVE EMBODIMENTS

Figure 1:
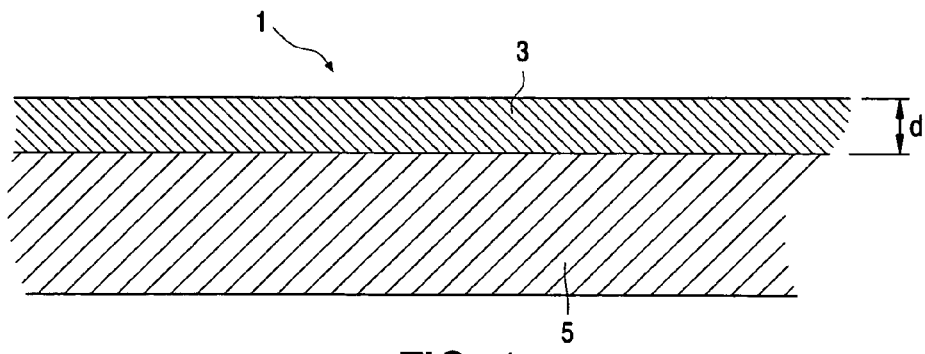
FIGS. 1 to 7 show the different steps in the fabrication of a semiconductor device according to embodiments of the invention.

FIG. 1 shows a silicon on insulator (SOI)-device 1 as is readily available. The SOI-device 1 comprises a monocrystalline silicon layer 3 formed on an insulating layer 5. The SOI-device 1 may be fabricated by means of any presently known technique, such as epitaxial growth. Below insulating layer 5, there may be provided a substrate (not shown) e.g. made of a semiconductor. The silicon layer 3 has a thickness d.

Figure 2:
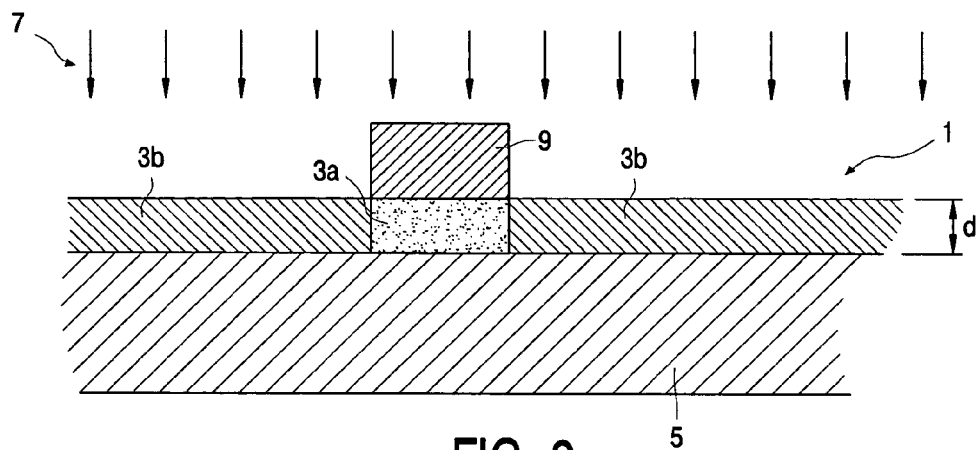

In FIG. 2, a first mask 9 is positioned on the monocrystalline silicon layer 3. The assembly of the SOI-device 1 and the first mask 9 is exposed to an implanting action (bombardment) with particles 7. The particles 7 may, for example, comprise at least one of the set comprising Ge, $GeF_2$ and Si. However, also atoms like xenon (Xe), argon (Ar) or indium (In), arsenic (As), phosphor (P) or ions may be applied. The particles 7 bring about the amorphization of the layer 3. No amorphization, however, takes place where the layer 3 is shielded by the first mask 9. The amorphized portions of the layer 3 are referred to with reference numeral 3b and the portion that remains monocrystalline is referred to with reference numeral 3a in FIG. 2. The particles 7 will penetrate the entire layer 3b i.e. over the thickness d of the layer 3, up to the interface with the insulating layer 5. The implantation parameters should be chosen appropriately to the desired properties of the active region, junction or transistor channel. However the amorphization parameter should be possibly tuned to produce minimal damage of the $Si/SiO_2$ interface (i.e. the interface between the silicon layer 3 and the insulating layer 5). Suitable parameters may be Ge at a dose of $10^{15}$ atoms/cm$^2$ and an energy of between 2 and 30 keV.

Figure 3:
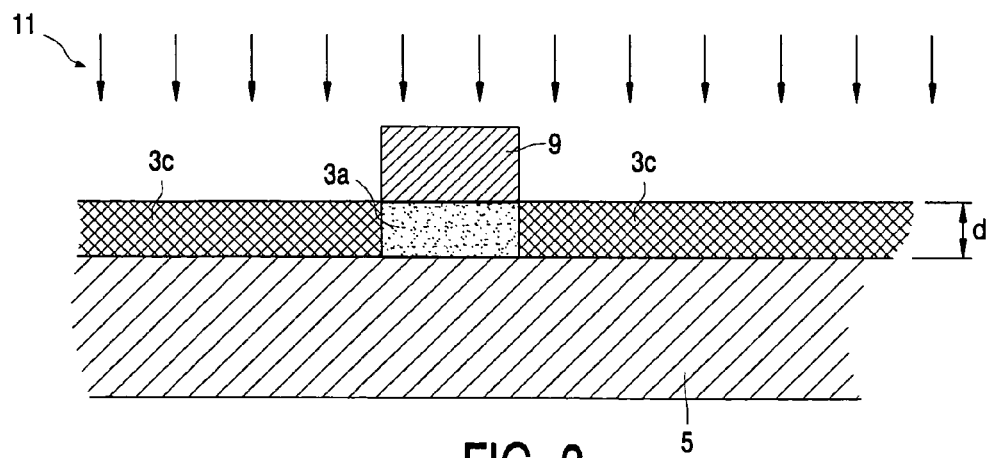

Subsequently, as shown in FIG. 3, the assembly of SOI-device 1 and first mask 9 is exposed to a dopant action by particles 11. The particles 11 comprise a suitable dopant. The dopant will easily be absorbed in the portion 3b, due to the amorphized nature of the latter. The portion 3b with dopant is referred to with reference numeral 3c in FIG. 3. On the contrary, limited dopant dose will penetrate the monocrystalline portion 3a. Note that this makes a very sharp and advantageous transition possible between dopant (amorphous) portion 3c and monocrystalline portion 3a.

Figure 4:
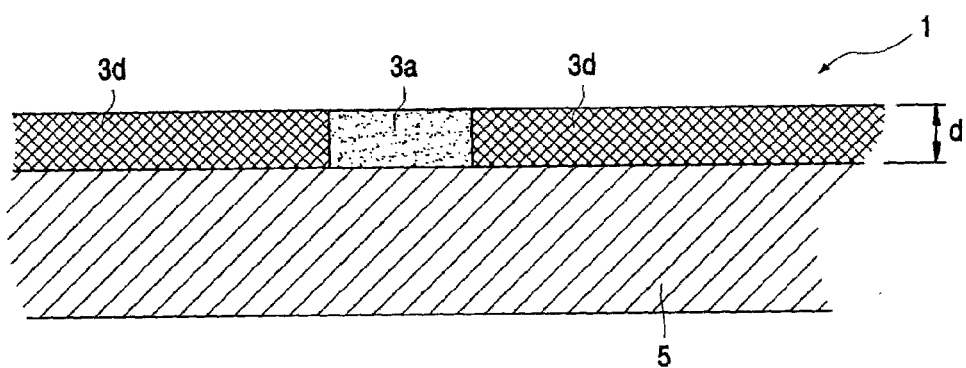

In FIG. 4, the first mask 9 that was present in the previous process steps is removed. The SOI-device 1 is then annealed. Typical temperatures used vary in between 550° C. and 750° C. during typical times between 1 second and 1 minute. This produces the so called "epitaxial regrowth". The presence of the monocrystalline portion 3a causes the adjacent doped portions 3c of the layer 3 to become monocrystalline as well after annealing. The monocrystalline portion 3a is in this context also referred to as "seed". After annealing, the SOI-device 1 thus comprises a monocrystalline layer 3 again. The doped portions 3c that are now monocrystalline are referred to with reference numeral 3d in FIG. 4. In a semiconductor device, one of the portions 3d may e.g. function as source and an other as drain.

Figure 5:
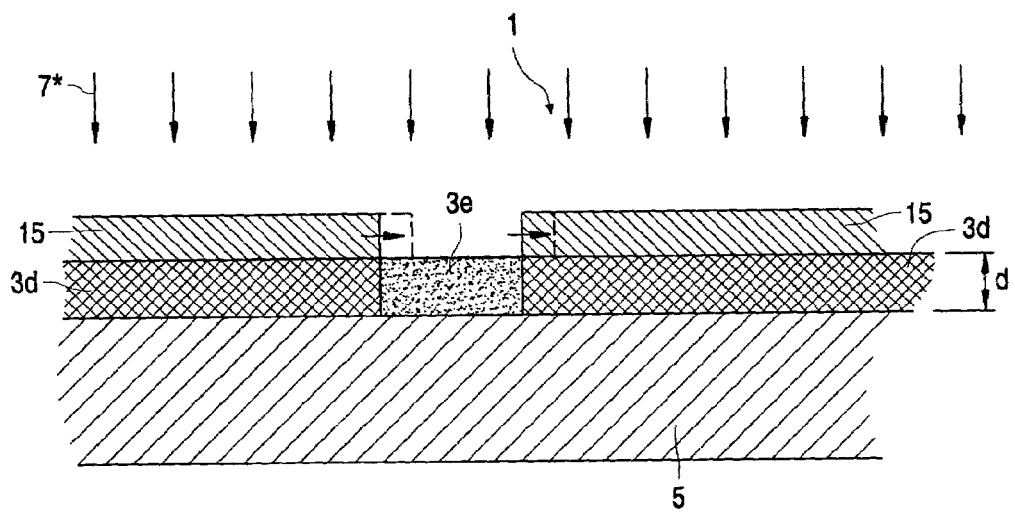

In FIG. 5, the (doped, monocrystalline) portions 3d of the SOI-device are covered by a second mask 15. Subsequently, the assembly is again exposed to an implanting action (bombardment) with particles 7* that may be equal to the particles 7 used as described in connection with FIG. 2 above. This time, as it is not shielded from the particles 7*, the portion 3a of the layer 3 is amorphized. It may be hard to position the second mask 5 exactly over the portions 3d. A slight shift, for instance to the right as indicated by the two small arrows in FIG. 5, of the second mask 5 relative to the portion 3d may cause amorphization in some part of the latter. In FIG. 5 this is indicated with a dashed line. Also, some amount of diffusion of the particles 7* under the mask 15 is likely to occur. This will make the transition between amorphous and monocrystalline portions in the layer less abrupt. This diffusion effect also has its influence on the "sharpness" of the transitions between the portion 3a and portion 3b in FIG. 2. The amorphization of the portion 3a over the entire thickness d of the layer 3 results in the formation of an amorphous portion 3e.

Figure 6:
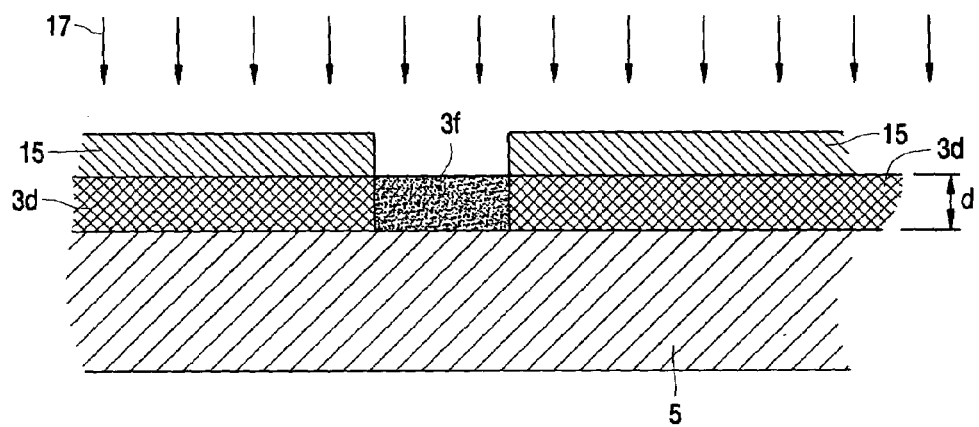

In FIG. 6 the assembly of SOI-device 1 and second mask 15 is exposed to another dopant action by particles 17. The particles 17 will penetrate the amorphous portion 3e of the layer 3. A doped portion 3f results. This portion 3f is still amorphous.

Figure 7:
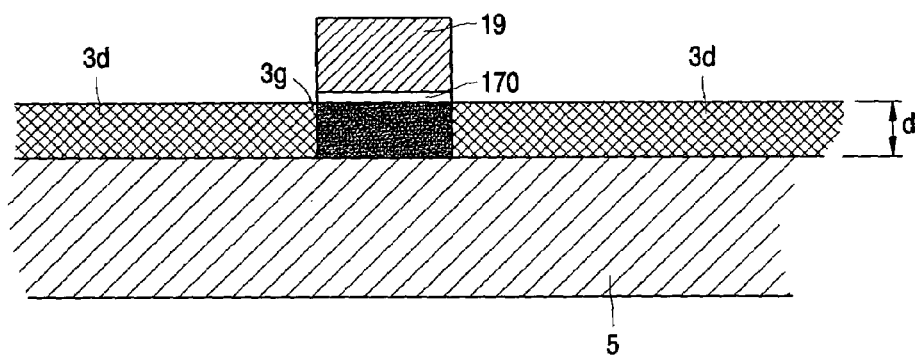

After removal of the mask 15 the SOI-device is annealed again (epitaxial regrowth). A suitable time period may be around 1 minute and a suitable temperature may be between 550° C. and 750° C. This time, the monocrystalline portions 3d adjacent to the amorphous portion 3f function as seeds. After annealing the SOI-device 1, a monocrystalline doped portion 3g results from the amorphous portion 3f. This portion 3g is shown in FIG. 7. Note that, alternatively, the implanting action (bombardment) by particles 7*, as explained in connection with FIG. 5, and the dopant action by particles 17, as explained in connection with FIG. 6, may be omitted. The latter is possible if the layer 3 already has the proper type and level of doping.

In FIG. 7, also a gate oxide 170 deposited on the doped portion 3g is shown. Above the gate oxide 170 a gate 19 is formed. As will be obvious to the person skilled in the arts, suitable connection layers and wires are needed to complete the fabrication of the semiconductor device which may typically be a transistor.

Typical particles used in the dopant action as explained in connection with FIG. 3 is boron (B) at an energy of less than 5 keV and a dose of $10^{15}$ atoms/cm$^2$. In the dopant action of FIG. 5 phosphor (P) at an energy of less than 70 keV and a dose of $1*10^{14}$–$3*10^{15}$ atoms/cm$^2$. Another option is arsenic (As) at an energy of less than 10 keV at a dose of $1*10^{14}$–$3*10^{15}$ atoms/cm$^2$. However, any other suitable combination of dopants, as known to persons skilled in the art, may be used. Moreover, other devices than (MOS) transistors may be produced in the SOI-device of FIG. 3.

The process steps amorphizing and doping, as explained in the above, may be integrated into a single process step if a self-amorphized dopant such as arsenic (As) is used.

While the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. The scope of the invention is indicated by the appended claims rather than by the foregoing description. All changes which come within the meaning and range of equivalency of the claims are to be embraced within their scope.

What is claimed is:

1. A method of producing a semiconductor devices comprising:
   providing a device with a monocrystalline semiconductor layer on an insulating layer;
   providing a mask on the semiconductor layer to form first shielded portions and first unshielded portions;
   amorphizing the first unshielded portions to yield first amorphized portions of the monocrystalline semiconductor layer;
   implanting a first dopant in the first amorphized portions; and
   applying a first solid phase epitaxial regrowth action to the semiconductor device while using the first shielded portions as monocrystalline seeds.

2. The method according to claim 1, further comprising:
   providing a second mask on the semiconductor layer to provide second shielded portions and second unshielded portions, at least some of the second unshielded portions substantially coinciding with the first shielded portions;
   amorphizing the at least some of the second unshielded portions to yield second amorphized portions;
   implanting a second dopant in the second amorphized portions; and
   applying a second solid phase epitaxial regrowth action to the semiconductor device.

3. The method according to claim 2, wherein the second solid phase epitaxial regrowth action includes annealing at a temperature between about 550° C. and about 750° C. during a period of about 1 second to about 1 minute.

4. The method according to claim 1, wherein the semiconductor layer has a thickness of between about 10 nm and about 100 nm.

5. The method according to claim 1, wherein the insulating layer is silicon dioxide ($SiO_2$).

6. The method according to claim 1, wherein the amorphizing is performed with particles selected from the set of Ge, $GeF_2$ and Si.

7. The method according to claim 1, wherein the amorphizing and the implanting are simultaneously performed with As.

8. The method according to claim 1, wherein the first solid phase epitaxial regrowth action includes annealing at a temperature between about 550° C. and about 750° C. during a period of about 1 second to about 1 minute.

9. A semiconductor device made by a method according to claim 1.

10. An apparatus comprising a semiconductor device according to claim 9.

* * * * *